United States Patent
Basceri et al.

(10) Patent No.: US 9,099,377 B2
(45) Date of Patent: Aug. 4, 2015

(54) MICROPIPE-FREE SILICON CARBIDE AND RELATED METHOD OF MANUFACTURE

(75) Inventors: Cem Basceri, Cary, NC (US); Yuri Khlebnikov, Raleigh, NC (US); Igor Khlebnikov, Raleigh, NC (US); Cengiz Balkas, Cary, NC (US); Murat N. Silan, Morrisville, NC (US); Hudson McD. Hobgood, Pittsboro, NC (US); Calvin H. Carter, Jr., Durham, NC (US); Vijay Balakrishna, Cary, NC (US); Robert T. Leonard, Raleigh, NC (US); Adrian R. Powell, Cary, NC (US); Valeri T. Tsvetkov, Gasburg, VA (US); Jason R. Jenny, Wake Forest, NC (US)

(73) Assignee: Cree, Inc., Durham, NC (US)

( * ) Notice: Subject to any disclaimer, the term of this patent is extended or adjusted under 35 U.S.C. 154(b) by 802 days.

(21) Appl. No.: 11/854,864

(22) Filed: Sep. 13, 2007

(65) Prior Publication Data

US 2008/0083366 A1    Apr. 10, 2008

Related U.S. Application Data (60) Provisional application No. 60/844,360, filed on Sep. 14, 2006.

(51) Int. Cl.
*C30B 23/00* (2006.01)
*C30B 29/36* (2006.01)
(Continued)

(52) U.S. Cl.
CPC .......... *H01L 29/1608* (2013.01); *C30B 23/002* (2013.01); *C30B 23/005* (2013.01);
(Continued)

(58) Field of Classification Search
CPC ...... C30B 29/36; C30B 23/005; C30B 23/02; H01L 21/02529
USPC .......... 117/84, 88, 89, 93, 101, 102, 105, 951
See application file for complete search history.

(56) References Cited

U.S. PATENT DOCUMENTS

| 4,866,005 A | 9/1989 | Davis et al. |
| 4,912,064 A | 3/1990 | Kong et al. |

(Continued)

FOREIGN PATENT DOCUMENTS

| EP | 1 659 198 A1 | 5/2006 |
| EP | 1783826 A1 | 5/2007 |

(Continued)

OTHER PUBLICATIONS

Schulze et al. "Near-equilibrium growth of micropipe-free 6H—SiC single crystals by physical vapor transport," Applied Physics Letters vol. 72, No. 13 p. 1632-34 (1998).*

(Continued)

*Primary Examiner* — Matthew Song
(74) *Attorney, Agent, or Firm* — Christopher J. Knors; Moore & Van Allen PLLC (57) ABSTRACT

Micropipe-free, single crystal, silicon carbide (SiC) and related methods of manufacture are disclosed. The SiC is grown by placing a source material and seed material on a seed holder in a reaction crucible of the sublimation system, wherein constituent components of the sublimation system including the source material, reaction crucible, and seed holder are substantially free from unintentional impurities. By controlling growth temperature, growth pressure, SiC sublimation flux and composition, and a temperature gradient between the source material and the seed material or the SiC crystal growing on the seed material during the PVT process, micropipe-inducing process instabilities are eliminated and micropipe-free SiC crystal is grown on the seed material.

31 Claims, 5 Drawing Sheets

(51) Int. Cl.
  *C30B 29/40* (2006.01)
  *H01L 29/16* (2006.01)
  *H01L 21/02* (2006.01)

(52) U.S. Cl.
  CPC ......... *C30B 29/36* (2013.01); *H01L 21/02378* (2013.01); *H01L 21/02433* (2013.01); *H01L 21/02529* (2013.01); *H01L 21/02631* (2013.01); *H01L 21/02634* (2013.01); *H01L 21/0254* (2013.01); *Y10T 428/21* (2015.01)

(56) References Cited

U.S. PATENT DOCUMENTS

| | | | |
|---|---|---|---|
| 5,679,153 | A | 10/1997 | Dmitriev et al. |
| 5,873,937 | A * | 2/1999 | Hopkins et al. ............... 117/105 |
| 6,053,973 | A | 4/2000 | Tanino et al. |
| 6,200,917 | B1 * | 3/2001 | Carter et al. ..................... 501/86 |
| 6,734,461 | B1 * | 5/2004 | Shiomi et al. ................... 257/77 |
| 6,814,801 | B2 | 11/2004 | Jenny et al. |
| 7,314,521 | B2 | 1/2008 | Powell et al. |
| 2003/0070611 | A1 | 4/2003 | Nakamura et al. |
| 2005/0126471 | A1 * | 6/2005 | Jenny et al. ...................... 117/92 |
| 2005/0160965 | A1 * | 7/2005 | Ohtani et al. .................... 117/13 |
| 2005/0205003 | A1 * | 9/2005 | Maruyama et al. ............. 117/84 |
| 2005/0230686 | A1 | 10/2005 | Kojima et al. |
| 2006/0075958 | A1 | 4/2006 | Powell et al. |
| 2006/0107890 | A1 | 5/2006 | Hobgood et al. |
| 2006/0180077 | A1 | 8/2006 | Suda et al. |
| 2006/0194379 | A1 | 8/2006 | Suda et al. |
| 2006/0254505 | A1 * | 11/2006 | Tsvetkov et al. ............. 117/104 |
| 2008/0067524 | A1 | 3/2008 | Basceri et al. |
| 2008/0237609 | A1 | 10/2008 | Powell et al. |

FOREIGN PATENT DOCUMENTS

| | | |
|---|---|---|
| JP | 2000-044395 | 2/2000 |
| JP | 2002-284599 | 10/2002 |
| JP | 2002334998 A | 11/2002 |
| JP | 2004200188 A | 7/2004 |
| JP | 2005310886 A | 11/2005 |
| JP | 2005314167 A | 11/2005 |
| JP | 2006203119 A | 8/2006 |
| WO | 2006041659 A2 | 4/2006 |
| WO | 2006041660 A2 | 4/2006 |

OTHER PUBLICATIONS

C. Basceri, I. Khlebnikov, Y. Khlebnikov, P. Muzykov, M. Sharma, G. Stratiy, M. Silan, C. Balkas; Growth of Micropipe-Free Single Crystal Silicon Carbide (SiC) Ingots via Physical Vapor Transport (PVT); (2006) Trans Tech Publications, Switzerland; Oct. 15, 2006.

Robert P. Devaty, David J. Larkin and Stephen E. Saddow; Silicon Carbide and Related Materials 2005; Materials Science Forum, vols. 527-529, p. 1670.

6th European Conference on Silicon Carbide and Related Materials; ECSCRM 2006; Newcastle Upon Tyne, UK; Sep. 3-7, 2006; p. 13.

Sumakeris, Joseph J. et al., Development of Epitaxial SiC Processes Suitable for Bipolar Power Devices, Trans Tech Publications, 2005, Switzerland, http://www.scientific.net.

Tsvetkov, V.F. et al., Recent Progress in SiC Crystal Growth, Inst. Phys. Conf. Ser. No. 142: Chapter 1, Silicon Carbide and Related Materials 1995 Conference, Kyoto, Japan.

Ultrahigh-quality silicon carbide single crystals, Toyota Central R&D Labs., Inc. Aug. 26, 2004, http://www.tytlabs.co.jp/office/ewhatsnew/etech/e20040826sic.html.

Amendment and 1.132 Declaration submitted Dec. 30, 2010 in Response to Non-Final Office Action of Sep. 1, 2010 for U.S. Appl. No. 11/854,878.

Cree, Inc., Japanese Application No. 2009-528471, Notification of Reasons for Rejection, Dec. 2, 2013.

Shiomi, H., et al., Crystal growth of micropipe free 4H—SiC on 4H—Sic{0 3 3 8} seed and high-purity semi-insulating 6H—SiC, Journal of Crystal Growth, 2006, pp. 188-191, vol. 292.

European Patent Office, EP Examination Report for Application No. 07 842 416.5-2203, dated May 16, 2012.

Basceri, Cem, Non-Final Office Action for U.S. Appl. No. 11/854,878 dated Jun. 7, 2012.

European Patent Office, EP Examination Report for Application No. 10 182 708.7-2203, dated May 25, 2012.

Nakamura, Daisuke, et al., "Ultrahigh-Quality silicon carbide single crystals", Nature, 430:1009-1012 (Aug. 26, 2004).

Chinese Patent Reexamination Board, Chinese Notification of Reexamination for Chinese Patent Application No. 200780042190.1 dated Oct. 8, 2012.

Japanese Patent Office, Japanese Office Action for Japanese Patent Application No. 2009-528471 dated Aug. 16, 2012.

Japanese Patent Office, Japanese Notification of Reasons for Rejection for Japanese Application No. 2009-528471, dated Mar. 4, 2013.

European Patent Office, Extended EP Search Report for Application No. 10182708.7, dated Sep. 26, 2011.

European Patent Office, Extended EP Search Report for Application No. 07842416.5, dated Sep. 26, 2011.

Chinese State Intellectual Prperty Office, Chinese Decision of Rejection for Chinese Application No. 200780042190.1, Dated Sep. 1, 2011.

Chinese State Intellectual Property Office, First Office Action dated Feb. 21, 2011 for Chinese Patent Application No. 200780042190.1/.

Japanese Patent Office; Japanese Office Action for Application No. 2014-116662 dated Mar. 25, 2015.

* cited by examiner

MICROPIPE-FREE SILICON CARBIDE AND RELATED METHOD OF MANUFACTURE

This application claims the benefit of U.S. Provisional Application No. 60/844,360 filed on Sep. 14, 2006.

BACKGROUND OF THE INVENTION

1. Field of the Invention

The present invention relates to a micropipe-free silicon carbide, micropipe-free silicon carbide single crystal wafers, and related methods of manufacture.

2. Description of Related Art

Single crystal silicon carbide (SiC) has proven to be a very useful material in the manufacture of various electronic devices. Due to its physical strength and excellent resistance to many chemicals, SiC may be used to fabricate very robust substrates adapted for use in the semiconductor industry. SiC has excellent electrical properties, including radiation hardness, high breakdown field, a relatively wide band gap, high saturated electron drift velocity, high-temperature operation, and absorption and emission of high-energy photons in the blue, violet, and ultraviolet regions of the optical spectrum.

SiC is conventionally produced using various seeded sublimation growth processes. Selected seeded sublimation growth processes are disclosed, for example, in U.S. Pat. Nos. 4,912,064, 4,866,005 (U.S. Reissue 34,861), and U.S. Pat. No. 5,679,153, the collective subject matter of which is hereby incorporated by reference.

In a typical SiC growth process, a seed material and source material are arranged in a reaction crucible which is then heated to the sublimation temperature of the source material. By controlled heating of the environment surrounding the reaction crucible, a thermal gradient is developed between the sublimating source material and the marginally cooler seed material. By means of the thermal gradient source material in a vapor phase is transported onto the seed material where it condenses to grow a bulk crystalline boule. This type of crystalline growth process is commonly referred to as physical vapor transport (PVT) process.

In conventional SiC growth processes, the reaction crucible is made of carbon (including, for example graphite and/or other carbon materials) and is heated using an inductive or resistive heating technique. The heating coils and associated insulation are carefully positioned in relation to the reaction crucible to establish and maintain the desired thermal gradient. Source material, such as powdered SiC, is commonly used in conjunction with vertically oriented reaction crucibles. The powdered SiC is retained in a lower portion of the reaction crucible and the seed material is positioned in an upper portion of the reaction crucible during the PVT process.

The unique properties of SiC substrates enable the design and fabrication of an array of high power and/or high frequency semiconductor devices. Continuous development over the past decade has lead to a level of maturity in the fabrication of SiC wafers that allows such semiconductor devices to be manufactured at commercially acceptable price points. However, certain materials-related problems continue to impede the broader use of SiC wafers as the substrate of choice in many commercial applications. These materials-related problems are largely the result of certain structural defects in the material composition of conventionally manufactured SiC, such as micropipes, dislocations (e.g., threading, edge, basal plane, and/or screw dislocations), hexagonal voids, stacking faults, etc. Each of these structural defects is caused by one or more discontinuities in the material lattice structure of the constituent SiC. Such structural defects are detrimental to fabrication and proper operation of semiconductor devices subsequently formed on the SiC substrate. Device yield and reliability suffer accordingly.

The nature and description of structural defects in SiC are well understood, and although the density of such defects has been reduced over time, relatively high defect concentrations still appear and have proven difficult to eliminate. (See, for example, Nakamura et al., "Ultrahigh quality silicon carbide single crystals," *Nature*, Vol. 430 at page 1009, (Aug. 26, 2004)).

Micropipes are common structural defects in SiC that develop or propagate during seeded sublimation growth processes. A micropipe is a hollow core, super-screw dislocation with its Burgers vector typically lying along the c-axis. A number of causes have been attributed to the generation of micropipes in SiC. These include inclusions of excess materials such as silicon or carbon inclusions, extrinsic impurities such as metal deposits, boundary defects, and the movement or slippage of partial dislocations. (See, e.g., Powell et al., Growth of low micropipe density SiC wafers," *Materials Science Forum*, Vols. 338-40, pp. 437-40 (2000)).

Other evidence suggests that micropipes are associated with hexagonal voids. Hexagonal voids are flat, hexagonal platelet-shaped cavities in the crystal that often have hollow tubes trailing beneath them. (See, e.g., Kuhr et al., "Hexagonal voids and the formation of micropipes during SiC sublimation growth," *Journal of Applied Physics*, Vol. 89, No. 8 at page 4625 (April 2001)).

With continuing efforts to commercialize SiC substrates and devices formed on SiC substrates, an increased emphasis has been placed on the quality of the constituent substrate material. For example, the so-called repeated a-face (RAF) growth approach has demonstrated micropipe-free SiC samples. However, this process can not be adapted for use in commercial applications due to its long process cycle time, complicated processing, difficulties in wafer diameter expansion and corresponding expense. Thus, while the industry has been able to steadily decrease the density of micropipes in commercial SiC substrates over time, there is a need for a SiC wafer growth process that is commercially viable and that provides single crystal SiC which is entirely free of micropipes.

SUMMARY OF THE INVENTION

Embodiments of the invention are directed to a micropipe-free silicon carbide (SiC), micropipe-free single crystal SiC wafers and substrates, and related methods of manufacture.

In one embodiment, the invention provides a method of growing a single-crystal of silicon carbide (SiC crystal) in the nominal c-axis growth direction using a physical vapor transport (PVT) process in a sublimation system, wherein the crystal is completely free of micropipe defects, the method comprising; attaching a seed material to a seed holder and forming a uniform thermal contact between the seed material and seed holder, placing a source material and the seed material attached to the seed holder in a reaction crucible, wherein constituent components of the sublimation system including at least the source material, the seed holder, and the reaction crucible are substantially free from unintentional impurities, and controlling growth temperature, growth pressure, SiC sublimation flux and composition, and a temperature gradient between the source material and the seed material or the SiC crystal growing on the seed material during the PVT process to eliminate micropipe-inducing process instabilities and grow the micropipe-free SiC crystal on the seed material.

In another embodiment, the invention provides a micropipe-free silicon carbide (SiC) wafer sliced from a SiC crystal grown in the nominal c-axis direction by a process of placing a source material and a seed material in a reaction crucible of a sublimation system, wherein constituent components of the sublimation system including at least the source material and the reaction crucible are substantially free from unintentional impurities, and controlling growth temperature, growth pressure, SiC sublimation flux and composition, and a temperature gradient between the source material and the seed material or a SiC crystal growing on the seed material during a physical vapor transport (PVT) process to eliminate micropipe-inducing process instabilities.

In another embodiment, the invention provides a semiconductor wafer comprising; a bulk single crystal silicon carbide (SiC) substrate sliced from a crystal grown in the nominal c-axis direction and having a micropipe density of zero, the SiC substrate comprising opposing first and second surfaces, an epitaxial layer formed on at least the first surface of the SiC substrate and comprising a concentration of dopant atoms defining a conductivity for the epitaxial layer, and a semiconductor device comprising source/drain regions formed in the epitaxial layer and defining a channel region in the epitaxial layer.

In another embodiment, the invention provides a semiconductor wafer comprising; a bulk single crystal silicon carbide (SiC) substrate sliced from a crystal grown in the nominal c-axis direction and having a micropipe density of zero, the SiC substrate comprising opposing first and second surfaces, an epitaxial layer formed on at least the first surface of the SiC substrate and comprising a concentration of dopant atoms defining a conductivity for the epitaxial layer, and a semiconductor device formed at least in part in the epitaxial layer.

In another embodiment, the invention provides a method of growing a single-crystal of Group III-nitride (Group III-nitride crystal) in a nominal c-axis growth direction using a physical vapor transport (PVT) process in a sublimation system, wherein the Group III-nitride crystal is completely free of micropipe defects, the method comprising; attaching a seed material to a seed holder and forming a uniform thermal contact between the seed material and seed holder, placing a source material and the seed material attached to the seed holder in a reaction crucible, wherein constituent components of the sublimation system including at least the source material, the seed holder, and the reaction crucible are substantially free from unintentional impurities, and controlling growth temperature, growth pressure, Group III-nitride sublimation flux and composition, and a temperature gradient between the source material and the seed material or the Group III-nitride crystal growing on the seed material during the PVT process to eliminate micropipe-inducing process instabilities and grow the micropipe-free Group III-nitride crystal on the seed material.

In another embodiment, the invention provides a semiconductor wafer comprising; a bulk single crystal silicon carbide (SiC) substrate sliced from a crystal having a minimum diameter of 3 inches and having a micropipe density of zero, the SiC substrate comprising opposing first and second surfaces, and an epitaxial layer formed on at least the first surface of the SiC substrate and comprising a concentration of dopant atoms defining a conductivity for the epitaxial layer.

DESCRIPTION OF EMBODIMENTS

Embodiments of the invention will now be described in relation to the accompanying drawings. However, the invention is not limited to only the embodiments described herein. Rather, the selected embodiments are presented as teaching examples.

For purposes of clarity, certain embodiments of the invention are described in the context of known processes and related equipment. Those of ordinary skill in the art will recognize that the scope of the invention are not limited to only these processes and associated equipment. Rather, as SiC growth processes and associated equipment change and evolve over the succeeding years, the teachings of the present invention will find ready application within these new contexts.

As is conventionally understood, a SiC boule may be grown using a seeded sublimation growth process, such as PVT, using a seeded sublimation system. Alternately, seeded sublimation systems may include high temperature CVD (HT-CVD) systems and halide CVD (H-CVD) systems. A resulting SiC boule may then be sliced using conventional techniques into wafers, and the individual wafers may then be used as seed material for a seeded sublimation growth process, or as substrates upon which a variety of semiconductor devices may be formed.

As previously noted, the general aspects of seeded sublimation growth processes for SiC are well established. Furthermore, those skilled in the field of crystal growth and particularly those skilled in the field of SiC growth and related systems will recognize that the details of a given technique can and will vary, usually purposefully, depending on many relevant circumstances and processing conditions. Accordingly, the descriptions given herein are most appropriately given in a general and schematic sense with the recognition that those persons of skill in the art will be able to implement and use various embodiments of the invention based on the provided disclosure without undue experimentation.

Figure 1:
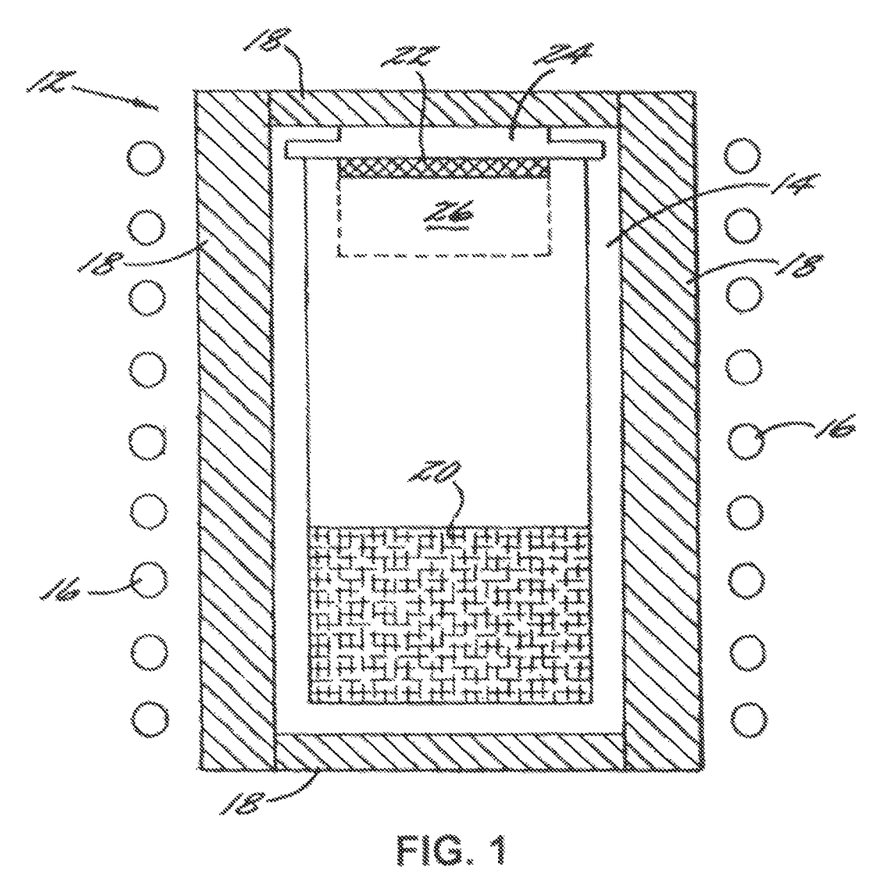
FIG. 1 is a schematic cross-sectional view of a seeded sublimation system in accordance with an embodiment of the present invention.

FIG. 1 is a cross sectional schematic diagram of a sublimation system 12 adapted for use in a seeded sublimation growth process of the type contemplated by certain embodiments of the invention. As in most conventional systems, sublimation system 12 includes a carbon reaction crucible (also referred to as a susceptor or growth cell) 14 and a plurality of induction coils 16 adapted to heat reaction crucible 14 when electrical current is applied. Alternatively, a resistive heating approach may be applied to the heating of reaction crucible 14. Using any competent heating mechanism and approach, the temperature within a furnace housing sublimation system 12 may be conventionally controllable.

The furnace housing sublimation system 12 will also typically include one or more gas inlet and gas outlet ports and associated equipment allowing the controlled introduction and evacuation of gas from an environment surrounding reaction crucible 14. The introduction and evacuation of various gases to/from the environment surrounding reaction crucible 14 may be conventionally accomplished using a variety of inlets/outlets, pipes, valves, pumps, gas sources, and controllers.

It will be further understood by those skilled in the art that sublimation system 12 may further incorporate in certain embodiments a water-cooled quartz vessel. Such further elements are, however, less relevant to embodiments of the invention and are omitted as being known in the art.

Additionally, those skilled in this art will recognize that SiC sublimation systems of the type described herein are commercially available in various standard configurations. Alternately, sublimation systems may be designed and implemented in custom configurations, where necessary or appropriate. Accordingly, the method embodiments described herein are not limited to a particular subset of sublimation systems, or any particular system configuration. Rather, many different types and configurations of sublimation systems may be used to grow micropipe-free SiC material in accordance with an embodiment of the invention.

Returning to FIG. 1, reaction crucible 14 is surrounded by insulation material 18. The composition, size, and placement of insulation material 18 will vary with individual sublimation systems 12 in order to define and/or maintain desired thermal gradients (both axially and radially) in relation to reaction crucible 14. For purposes of clarity, the term, "thermal gradient," will be used herein to describe one or more thermal gradient(s) associated with reaction crucible 14. Those skilled in the art recognize that "the thermal gradient" established in embodiments of the invention will contain (or may be further characterized as having) axial and radial gradients, or may be characterized by a plurality of isotherms.

Prior to establishment of the thermal gradient, reaction crucible 14 is loaded with one or more source materials. Conventionally available reaction crucibles include one or more portions, as least one of which is capable of holding source material, such as powdered SiC 20. Powdered source material(s) are most commonly, but not exclusively, used in seeded sublimation growth processes. As illustrated in FIG. 1, source material 20 is held in a lower portion of reaction crucible 14, as is common for one type of reaction crucible 14. Other competent reaction crucibles distribute source material in a vertical or cylindrical arrangement in which the source material surrounds a considerable portion of the interior of reaction crucible 14. Here again, reaction crucible 14 may be implemented in a number of different shapes, and may hold one or more source materials accordingly. Thus, while embodiments of the invention may use conventional reaction crucible designs, the scope of the present invention is not limited to such designs, but will find application in different sublimation systems using many different types of reaction crucibles.

However, returning again to FIG. 1, a seed material 22 is placed above or in an upper portion of reaction crucible 14. Seed material 22 may take the form of a mono-crystalline SiC seed wafer having a diameter of about 2 inches, 3 inches (75 mm) or 4 inches (100 mm). A SiC single crystal boule 26 will be grown from seed material 22 during the seeded sublimation growth process.

In the embodiment illustrated in FIG. 1, a seed holder 24 is used to hold seed material 22. Seed holder 24 is securely attached to reaction crucible 14 in an appropriate fashion using conventional techniques. For example, in the orientation illustrated in FIG. 1, seed holder 24 is attached to an uppermost portion of reaction crucible 14 to hold seed material 22 in a desired position. In one embodiment, seed holder 24 is fabricated from carbon.

In certain embodiments of the invention, one or more type of dopant atoms may be intentionally introduced into sublimation system 12 during or before the seeded sublimation process. For example, one or more dopant gases may be introduced into the seeded sublimation environment and thereby incorporated into the growing SiC crystalline boule. Dopants may be selected for their acceptor or donor capabilities in accordance with the conductivity properties desired for the resulting SiC boule. For certain semiconductor devices, donor dopants produce n-type conductivity and acceptor dopants produce p-type conductivity. Some commonly incorporated n-type dopants include N, P, As, Sb, and/or Ti. Some commonly incorporated p-type dopants include B, Al, Ga, Be, Er, and/or Sc.

In a typical sublimation growth process according to an embodiment of the invention, an electrical current having a defined frequency to which the material (e.g., carbon) forming reaction crucible 14 will respond is passed through induction coils 16 to heat reaction crucible 14. The amount and placement of insulation material 18 are selected to create a thermal gradient between a source material 20 and a seed material 22. Reaction crucible 14 is heated with source material 20 to a sublimation temperature above about 2000° C., and typically ranging from about 2100° C. to 2500° C. In this manner, a thermal gradient is established such that the temperature of seed material 22 and the SiC crystalline boule 26 growing on the seed material 22 remains slightly below the temperature of source material 20. In this manner, certain vaporized species generated from the sublimating SiC source (e.g., Si, $Si_2C$ and/or $SiC_2$) are thermodynamically transported first to seed material 22 and thereafter to the growing SiC crystalline boule 26 (or "the SiC crystal").

Once the SiC crystal 26 has reached a desired size, the crystal growth process is terminated by reducing the temperature of sublimation system 12 below about 1900° C. and/or raising the pressure of the environment surrounding reaction crucible 14 above about 400 Torr.

With the foregoing exemplary system and process in mind and in view of recent studies concerning the control of nucleation and propagation of micropipe defects in SiC crystals grown using PVT processes, it has been determined that during bulk growth of the SiC boule, foreign polytype nucleation, such as 3C-polytype, occurs at the initial stages of growth (nucleation period) and/or during subsequent growth in the presence of facets. These observations suggest that polytype instability during crystal growth adversely impacts micropipe density. Based on this concept, embodiments of the invention as hereinafter described focus on the optimization of growth conditions for nucleation and growth stages. These optimized growth conditions implemented in a PVT growth environment provide a growth process that realizes highly effective polytype control. Under these growth conditions, micropipes induced on the seed material and/or formed during growth are practically, if not completely, eliminated. In fact, micropipe-free 2-inch, 3-inch, and 100 mm diameter 4H—SiC crystals, as well as 2-inch and 3-inch 6H—SiC crystals have been demonstrated using various embodiments of the invention.

Figure 2A:
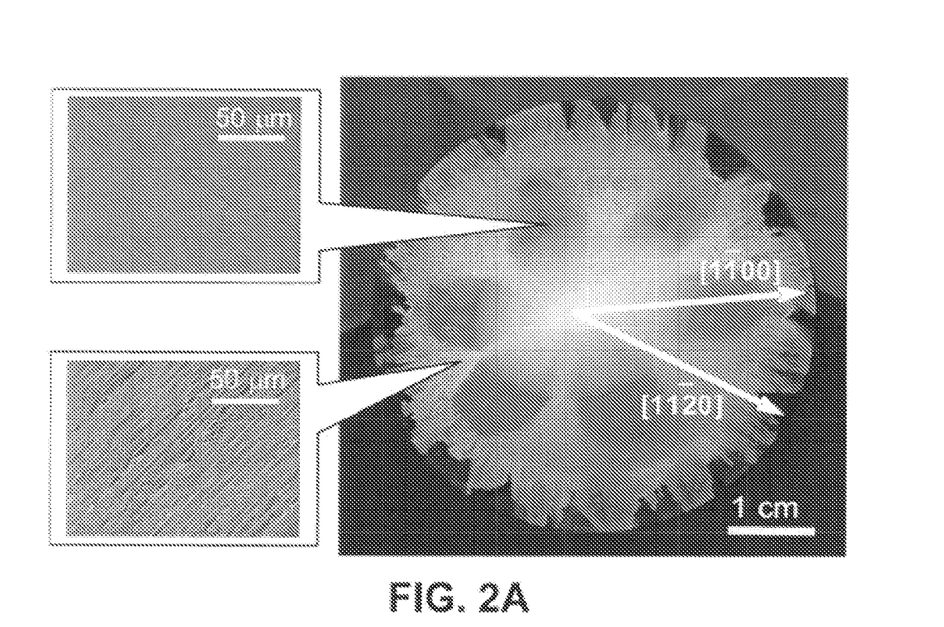
FIGS. 2(a) and 2(b) are photographic images respectively showing an etched surface of a 6H—SiC crystal (initial stage of growth), and distribution of polytype inclusions in 6H—SiC boule (bulk growth stage)
Figure 2B:
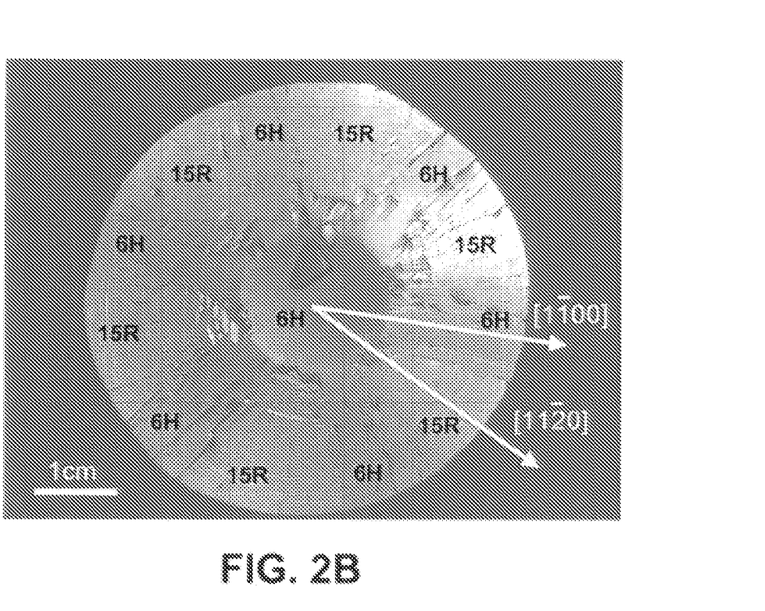

During SiC bulk growth using a seeded sublimation process as described above, foreign polytype nucleation, such as 3C-polytype, typically occurs at the initial stages (nucleation period) and may even continue to nucleate during subsequent growth stages in the presence of the (0001) facet at the growth front, as shown in FIGS. 2(a) and 2(b). Similarly, 15R-polytype may nucleate on 3C-polytype inclusions both in 4H— and 6H—SiC boules. Instability in process parameters, such as pressure and temperature during the initial stage of growth, may cause polytype inclusion.

The presence of facet boundaries, which can form at different stages of the bulk growth process, increases the probability of polytype nucleation due to the reduced surface energy along these interfaces. Step-bunching and increased dislocation densities generally form along the [$11\bar{2}0$] direction (and its family). In the vicinity of facet boundaries, the density of such defects increases further. Additionally, the concentration of unintended impurities tends to increase in these areas, causing stress generation and lattice mismatch. The presence of facet boundaries and polytype inclusions, extending from atomic levels to macroscopic scales, leads to increased defect levels including micropipe formation in SiC crystals. It should also be noted that the concentration and/or the composition of SiC source flux plays a critical role in forming defects discussed above. As such, the growth process parameters are carefully examined to find suitable conditions so that polytype inclusions and defect formation around such facet boundaries are reduced and/or prevented.

On the etched surface of the 6H—SiC crystal representing the initial stage of the growth process as shown in FIG. 2(a), anisotropy of the growth steps distribution from the center of the crystal to the crystal edge produces a discernable contrast. Along the [$1\bar{1}00$] crystallographic direction, surface morphology suggests the presence of a step-flow growth mechanism. Along this [$11\bar{2}0$] direction, step bunching formation is observed, likely indicating increased growth rate in this direction. It is expected that differences in growth rate along [$1\bar{1}00$] and [$11\bar{2}0$] crystallographic directions may result in step deformation and generation of a large number of kinks from which dislocations are formed. Such conditions promote the formation of polytype inclusions, which thus result in formation of micropipes. FIG. 2(b) shows the 15R polytype inclusion in a 6H crystal occurring in the [$11\bar{2}0$] direction and its family. This is confirmed by photoluminescence and UV absorption characteristics.

Figure 3:
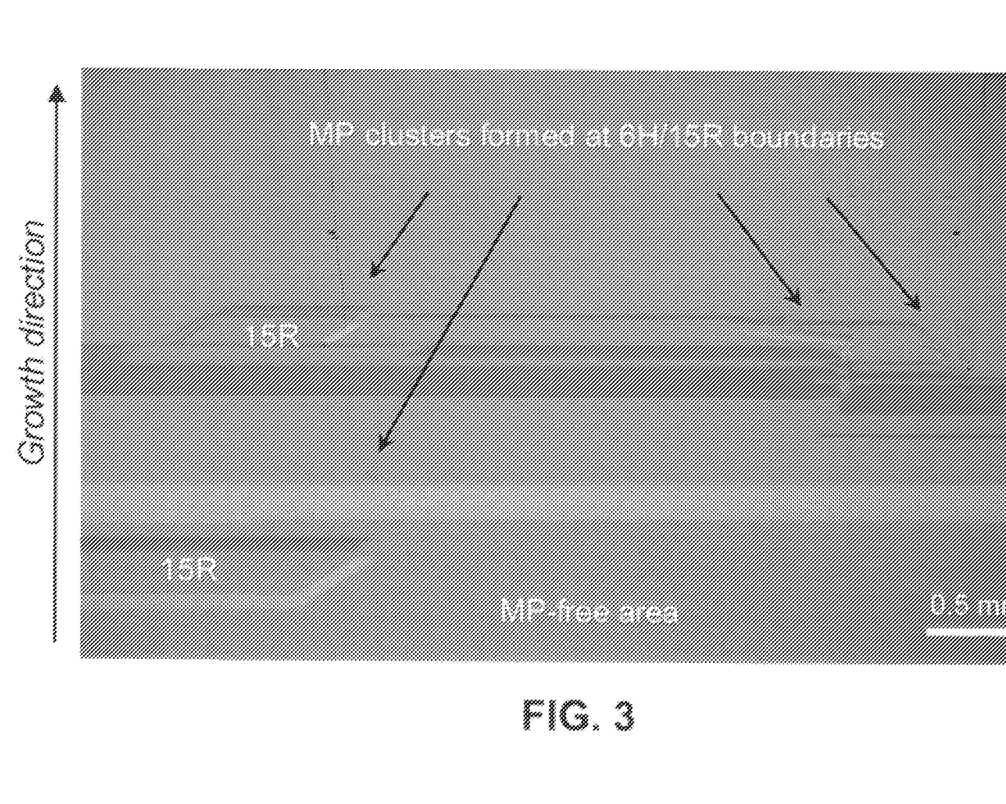
FIG. 3 is an image showing micropipe formation at 6H-15R polytype boundaries.
Figure 4A:
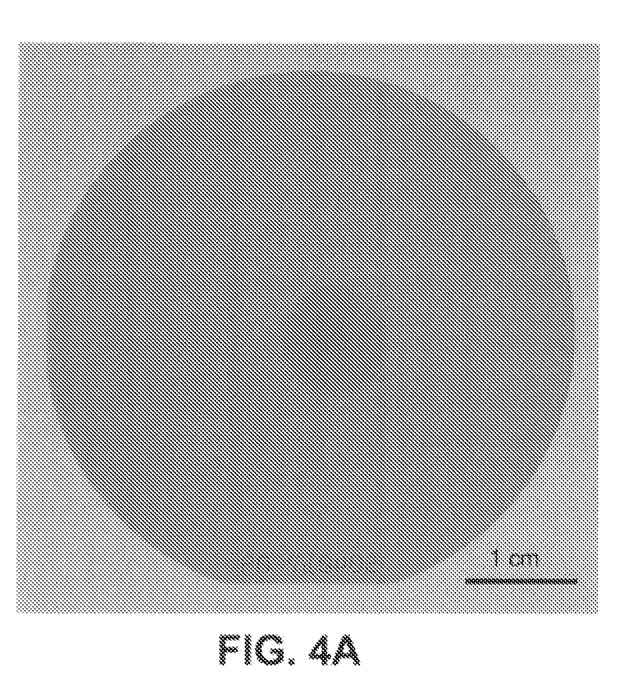
FIGS. 4(a)-4(c) are photographs respectively showing micropipe-free 4H—SiC substrates including an optical image of a 2-inch diameter wafer, a cross-polarized image of a 2-inch diameter wafer, and a cross-polarized image of a 3-inch diameter wafer according to various embodiments of the invention.
Figure 4B:
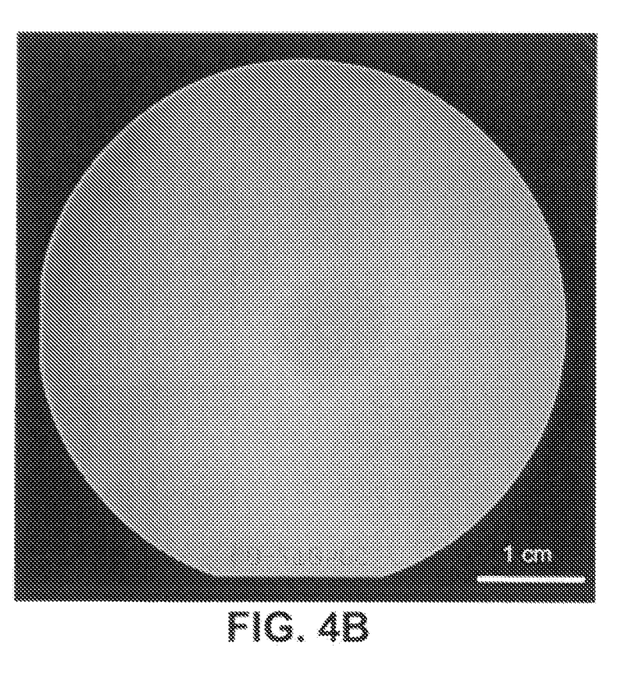
Figure 4C:
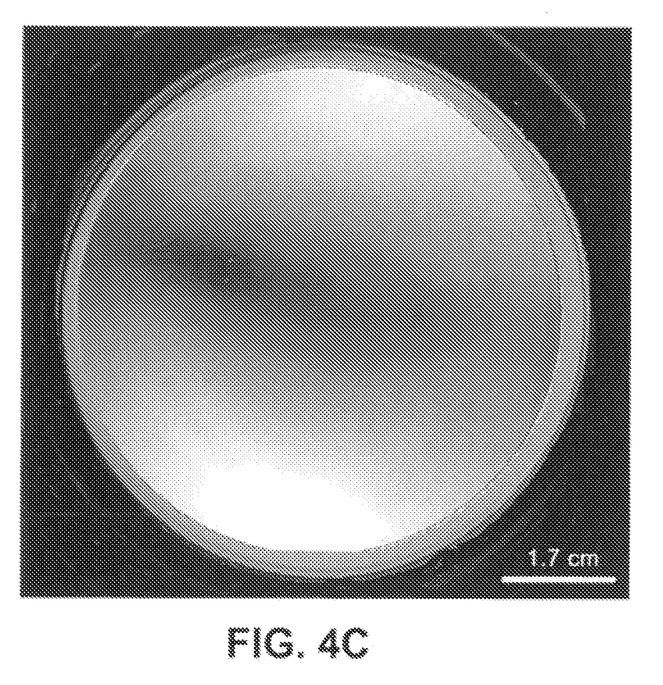
Figure 5:
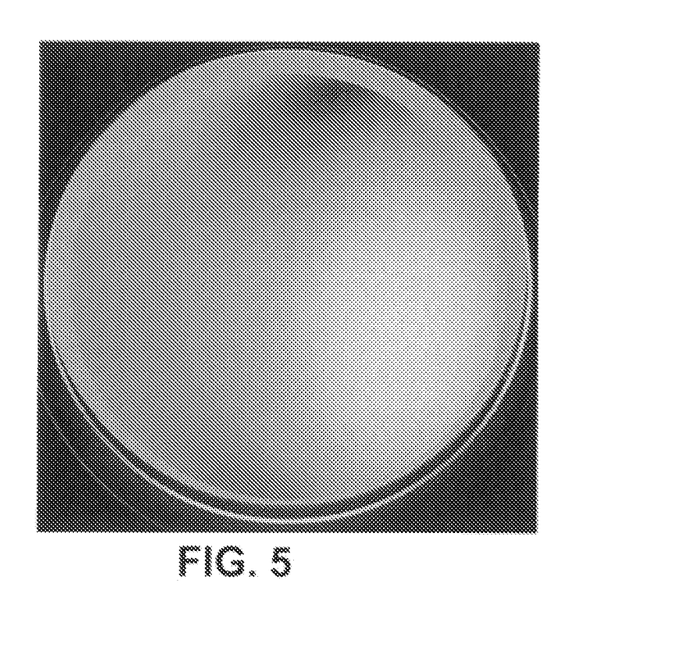
FIG. 5 is a photograph showing a 100 mm diameter micropipe-free 4H—SiC wafer and fabricated in accordance with an embodiment of the invention.

A cross-section of a 6H—SiC boule (cut along the c-axis direction) containing 15R-polytype inclusions is shown in FIG. 3. Formation of micropipe clusters is shown on the 6H/15R boundaries.

As an example, and consistent with the above noted studies, it has been observed that: (1) step bunching occurs at the facet border in the [$11\bar{2}0$] direction; (2) the facet border is the preferred area for new polytype nucleation which generally propagates in the [$11\bar{2}0$] direction(s); and (3) micropipe generation starts from polytype inclusions which are nucleated at polytype boundaries.

In a method of growing a micropipe-free, single crystal boule of SiC according to an embodiment of this application, the SiC boule is grown nominally in the c-axis direction, where the nominal c-axis direction is defined as being within the range of zero to 10 degrees from the c-axis [0001] direction. Initially, unintentional impurities within the system (as compared with dopants intentionally introduced into the sublimation system) are targeted for elimination as a first possible source of micropipe nucleation. In particular, unintentional impurities on the seed or growth front may start to nucleate a micropipe and/or micropipe clusters that may propagate throughout the SiC boule.

For example, unintentional impurities within the source material (e.g., the powdered SiC source material 20 in the sublimation system as shown in FIG. 1) may be eliminated by providing a very high quality SiC source material having as low an impurity content as possible. Common source material impurities include, as examples, iron, nickel and/or chromium. Where very high quality SiC source material of verified purity may be obtained, its incorporation within an embodiment of the invention is warranted. However, one or more high quality source materials (as potentially provided in solid, powder, liquid, and/or gaseous form(s)) may be employed as SiC source material in a sublimation or evaporation system consistent with certain embodiments of the invention where such source material(s) contain a total concentration of less than 5 parts per million by weight (ppmwt) of metallic impurities, and more preferably less than 2 ppmwt of metallic impurities. In this context, metallic impurities include at least metals such as Ti, V, Cr, Mn, Fe, Co, Ni, Cu, Zn, Zr, Mo, Pd, Ta, and/or W. Indeed, certain embodiments for the invention provide that the SiC source material(s) being used contain a total concentration of less than 1 ppmwt of Ti, V, Cr, Mn, Fe, Co, Ni, Cu, Zn, Zr, Mo, Pd, Ta, and/or W.

In addition to the provision of very high quality source material(s), certain embodiments of the invention demand that the reaction crucible and seed material holder be fabricated from high quality, very pure carbon having as low a metal content as possible. In this regard, the reduction of metallic impurities in the materials forming the source, reaction crucible, and seed holder may be confirmed using glow discharge mass spectroscopy (GDMS) and secondary ion mass spectroscopy (SIMS) analysis techniques.

Following the foregoing efforts to eliminate unintentional impurities as a source of micropipe generation, polytype inclusions (as previously described) are targeted as the remaining source for micropipe generation. By precise and tight control of vapor phase composition, the diffusion rate of the vapor species, growth temperature, pressure during bulk growth, source flux, ambient gases and growth zone dimensions such polytype inclusions may be eliminated. More particularly, instabilities during crystal growth, such as temperature spikes, pressure deviations or any changes in growth conditions, may cause polytype inclusions. Tight control of these processing parameters to maintain stable growth conditions eliminates polytype inclusions, thus preventing micropipe formation.

It should be understood as noted above, those familiar with the growth of crystals, particularly in difficult material systems such as silicon carbide, will recognize that the details of the given technique can vary depending on relevant circumstances. Typically, growth pressure during an applied PVT process will range from about 0.1 to 400 Torr, and more typically between 0.1 and 100 Torr. As noted above, the process temperature will range from about 2000° C. to 2500° C. These conditions may vary due to differences in the sublimation system being used and variations in the seeded sublimation growth process being run.

However, regardless of system and process variables, embodiments of the invention demand that the desired growth pressure and process temperature be strictly controlled without significant transients, in order to eliminate the occurrence of polytype inclusions and thereby prevent the formation of micropipes.

In accordance with various embodiments of the invention, 2-inch, 3-inch, and 100 mm diameter wafers of conductive 4H—SiC, and 2-inch and 3-inch semi-insulating 6H—SiC single crystals have been produced as shown in FIGS. 4(a), 4(b), 4(c) and FIG. 5. It should be noted that these crystals, formed in accordance with an embodiment of the invention, were completely free of micropipes. These early examples of material obtained by embodiments of the invention are not limiting. Indeed, the present invention is scalable to the fabrication of 125 mm, 150 mm, and greater diameter crystals of various materials having different conductivity types.

Using the foregoing sublimation system, or an equivalent, certain embodiments of invention provide various methods of growing single-crystal SiC that is completely free of micropipe defects. These methods employ PVT to grow the SiC and generally provide for crystal growth along the nominal c-axis direction. However, embodiments of the invention are applicable to SiC crystal growth in a nominal direction within a range of from zero to 10 degrees from the c-axis direction. In one more specific embodiment, the growth direction is within 4 degrees of the c-axis direction with the tilt toward the [11$\bar{2}$0] or the [1$\bar{1}$00] direction.

As noted above, crystal growth proceeds from a high quality seed. In certain embodiments of the invention, the seed may be implemented in wafer form from a material characterized by a micropipe density of less than 2 cm$^{-2}$, and more preferably by a micropipe density of less than 1 cm$^{-2}$.

Alternately, an acceptable SiC seed wafer may be characterized by one having a uniform x-ray diffraction exhibiting a full width at half maximum of less than 50 arcsec, and more preferably less than 30 arcsec. Alternately, an acceptable SiC seed wafer is one characterized by no extraneous polytype inclusions.

The attachment of the seed material (i.e., a seed wafer) to a corresponding seed holder within a sublimation system should be made by means of a uniform thermal contact. Various conventionally understood techniques may be used to implement a uniform thermal contact. For example, the seed material may be placed in direct physical contact with the seed holder, or an adhesive may be used to fix the seed material to the seed holder, so as to ensure that conductive and/or radiative heat transfer is uniform over substantially the entire area between the seed and the seed holder. Alternately, a wafer holder comprising a controlled gap structure may be used to define and maintain a desired separation gap between the seed material and the seed holder. It will also be understood by those skilled in the art that the use of a controlled gap structure requires a protective backside surface coating on the seed material (i.e., on the surface opposite to the growth surface) so that the seed material will not inadvertently sublimate during the growth process. In various embodiments of the invention, a controlled gap structure may be used to form a separation distance between the seed material and seed holder of 10 μm or less, 5 μm or less, 2 μm or less, and where practically possible less than 1 μm.

With an appropriate seed material selected (and its compositional purity verified), and with the seed material properly attached to a seed holder in a reaction crucible environment substantially free from metallic impurities, the elimination of micropipe-inducing process instabilities becomes the primary focus of various embodiments of the invention. By carefully controlling process conditions using known automated, semi-automated, and human directed control techniques the temperature, pressure, temperature gradient, and resulting SiC sublimation flux may be precisely defined and maintained over a desired process period.

In certain embodiments of the invention, growth pressure is controlled in a range of about 300 to 0.1 torr, and more preferably in a range of about 50 to 0.1 torr. The process temperature is controlled in a range of about 2000 to 2500° C. The thermal gradient between the growing crystal and the source material is controlled in a range of about 50 to 150° C./cm. A sublimating SiC species flux during the process period may be controlled by a ramped increase in the growth temperature in the range of 0.3 to 10° C./hr.

It has been clearly demonstrated by certain CVD and liquid phase SiC epitaxial studies, (see, for example, J. Sumakeris et al., 5th European Conference on Silicon Carbide and Related Materials (2004) and U.S. Pat. No. 5,679,153), that micropipes in single crystal SiC substrates can be reduced and/or eliminated by over-grown SiC epitaxy layers. This result may be achieved by controlling the input quantities of Si and C reactants, and thereby controlling the Si/C ratio during epitaxial growth. Such overgrowth under slightly silicon-rich conditions dissociates the large Burgers vector micropipes in the single crystal SiC substrate into a number of threading screw dislocations having smaller Burgers vectors that do not form open pipes structures in the resulting epitaxial layer.

Thus, in certain embodiments of the invention, it has been found that this particular micropipe reduction (elimination) mechanism may be extended to a sublimation growth method for bulk, as opposed to epitaxial, SiC crystals. This inventive extension proposes that at the beginning of the overall growth process (i.e., the growth nucleation phase), micropipes in seed material may be overgrown by; using a low micropipe density, but not necessarily micropipe-free seed material, and controlling the growth nucleation temperature, such that a modified Si/C ratio is induced by a low "start temperature" which promotes the closing-off of any micropipes existing in the seed material during the initial stages of bulk growth. In one more particular embodiment of the invention, this start temperature ranges between about 2000 to 2200° C.

As is conventionally understood, a sublimation process consistent with an embodiment of the invention may include the steps of first evacuating the environment around the reaction crucible to remove ambient air, gaseous impurities and extraneous solid particulates. Then, the reaction crucible is placed under pressure using one or more inert gas(es). Then, the sublimation system heats the reaction crucible environment to a temperature enabling SiC crystal growth via PVT. Once this temperature is reached, the pressure within the sublimation system is reduced to a point sufficient to initiate SiC crystal growth.

Micropipe-free SiC crystals of various polytype may be grown including at least 3C, 4H, 6H, and 15R. Wafers cut from such SiC crystals may be subsequently used in the fabrication of various substrates. For example, using known techniques, high quality semiconductor wafers may be fabricated that include homo-epitaxial layers, such as SiC, as well as hetero-epitaxial layers, such as Group III-nitrides, on at least one surface thereof. The Group III-nitride layer may be, for example, GaN, AlGaN, AlN, AlInGaN, InN, and/or AlInN.

In this manner, semiconductor wafers may be fabricated that include a bulk single crystal SiC substrate having a diameter of at least 2 inches, 3 inches, 4 inches (100 mm) or larger and having a micropipe density of zero. The SiC substrate will include at least one and possibly two primary (and opposing) surfaces. As is conventionally understood, a plurality of active and/or passive devices may be fabricated on the SiC substrate.

In one embodiment, prior to the formation of the plurality of devices, an epitaxial layer may be formed on the primary surface of the substrate. This epitaxial layer may include a concentration of dopant atoms, sufficient to define a desired conductivity for the epitaxial layer. Source/drain regions may then be formed in the epitaxial layer to define channel regions for the devices. Thereafter, conventional semiconductor fabrication processes may be sequentially applied to the surface of the SiC wafer to form desired semiconductor devices, such as transistor(s) having conventional gate structure(s) (e.g., oxide or metal gate structures) formed over defined channel region(s). Selected examples of such transistors include; metal oxide semiconductor field-effect transistors, junction field-effect transistors, hetero-field-effect transistors, and metal semiconductor field-effect transistors.

Alternatively, in other embodiments of the invention, prior to the formation of semiconductor device(s), an epitaxial layer is formed on at least one primary surface of the substrate. The epitaxial layer may include selected concentration(s) of dopant atoms sufficient to define a desired conductivity for the epitaxial layer. Thus formed, the epitaxial layer may be used to fabricate one or more Schottky barrier diode(s), junction barrier Schottky diode(s), PiN diode(s), thyristor(s), and/or bipolar junction transistors on the epitaxial layer.

In view of the foregoing description, micropipe-free substrates may be used to broaden the application of SiC material in the fabrication of semiconductor devices and electronic devices. It should be noted that the foregoing embodiments are not intended to be an exhaustive recitation of the scope of the subject invention. Rather, those skilled in the art will recognize that various modifications and adaptations to the foregoing may be made without departing from the scope of the invention as defined by the appended claims.

For example, in one such modification, any one of the foregoing method embodiments may be adapted to grow a Group III-nitride on seed material. That is, a single-crystal of Group III-nitride (Group III-nitride crystal) having a nominally c-axis growth direction may be grown using a physical vapor transport (PVT) process in a sublimation system. Such a Group III-nitride crystal will be completely free of micropipe defects. One method for growing a Group III-nitride crystal includes; attaching a seed material to a seed holder using a uniform thermal contact, placing a source material and the seed material attached to the seed holder in a reaction crucible associated with the sublimation system, wherein constituent components of the sublimation system including at least the source material, the seed holder, and the reaction crucible are substantially free from unintentional impurities, and controlling growth temperature, growth pressure, Group III-nitride sublimation flux and composition, and a temperature gradient between the source material and the seed material or the Group III-nitride crystal growing on the seed material during the PVT process to eliminate micropipe-inducing process instabilities and grow the micropipe-free Group III-nitride crystal on the seed material.

What is claimed is:

1. A method of growing a single-crystal of silicon carbide (SiC crystal) in the nominal c-axis growth direction using a physical vapor transport (PVT) process in a sublimation system, the method comprising:
    attaching a seed material to a seed holder and forming a uniform thermal contact between the seed material and seed holder;
    placing a source material and the seed material attached to the seed holder in a reaction crucible, wherein constituent components of the sublimation system including at least the source material, the seed holder, and the reaction crucible are substantially free from unintentional impurities; and
    controlling growth temperature, growth pressure, SiC sublimation flux and composition, and a temperature gradient between the source material and the seed material or the SiC crystal growing on the seed material during the PVT process to eliminate micropipe-inducing process instabilities and grow the SiC crystal on the seed material, wherein the SiC sublimation flux is controlled by ramping up the growth temperature in the range of from about 0.3 to 10° C./hr, wherein the single crystal of silicon carbide (SiC crystal) has a micropipe density of zero.

2. The method of claim 1, further comprising:
    after placing the source material and the seed holder with attached seed material in the reaction crucible and placing the reaction crucible in the sublimation system, and then evacuating the sublimation system to remove ambient air, gaseous impurities and extraneous solid particulates;
    backfilling the sublimation system using at least one inert gas;
    heating the sublimation system to a temperature facilitating SiC crystal growth; and
    reducing the pressure on the reaction crucible within the sublimation system to initiate SiC crystal growth.

3. The method of claim 1, wherein the nominal direction of SiC crystal growth ranges from between zero to 10 degrees from the c-axis direction.

4. The method of claim 3, wherein the nominal direction of SiC crystal growth ranges from between zero to about 4 degrees of the c-axis direction with the tilt toward the [11$\bar{2}$0] or the [1$\bar{1}$00] direction.

5. The method of claim 1, wherein the micropipe-free SiC crystal has polytype selected from a group of polytypes consisting of 3C, 4H, 6H, and 15R.

6. The method of claim 1, wherein the seed material comprises a SiC seed wafer having a micropipe density of less than 2 cm$^2$.

7. The method of claim 1, wherein the seed material comprises a SiC seed wafer having a micropipe density of less than 1 cm$^2$.

8. The method of claim 1, wherein the seed material comprises a SiC seed wafer characterized by a uniform x-ray diffraction exhibiting a full width at half maximum of less than 50 arcsec.

9. The method of claim 1, wherein the seed material comprises a SiC seed wafer characterized by a uniform x-ray diffraction exhibiting a full width at half maximum of less than 30 arcsec.

10. The method of claim 1, wherein the seed material comprises a SiC seed wafer having no extraneous polytype inclusions.

11. The method of claim 1, wherein attaching the seed material to the seed holder is accomplished using direct physical contact between the seed material and the seed holder, with or without use of an adhesive between the seed material and the seed holder, or using a controlled gap structure including thermal backside protection of the seed material.

12. The method of claim 11, wherein the controlled gap structure maintains a separation distance between the seed material and the seed holder selected from a group of separation distances consisting of 10 μm or less, 5 μm or less, 2 μm or less, and 1 μm or less.

13. The method of claim 1, wherein the growth pressure is controlled in a range of from about 760 to 0.1 torr.

14. The method of claim 1, wherein the growth pressure is controlled in a range of from about 300 to 0.1 torr.

15. The method of claim 1, wherein the growth pressure is con oiled in a range of from about 50 to 0.1 torr.

16. The method of claim 1, wherein the process temperature is controlled in a range of from about 2000 to 2500° C.

17. The method of claim 1, wherein a start temperature associated with growth nucleation for the SiC crystal is controlled in a range of from about 2000 to 2200° C.

18. The method of claim 1, wherein the thermal gradient is controlled in a range of from about 50 to 150° C./cm.

19. The method of claim 1, wherein the source material comprises at least one of a high purity solid, powder, liquid, and gas.

20. The method of claim 19, wherein the source material contains a total concentration of metallic impurities of less than 5 parts per million by weight.

21. The method of claim 19, wherein the source material contains a total concentration of metallic impurities of less than 2 parts per million by weight.

22. The method of claim 19, wherein the source material contains a total concentration of metallic impurities of less than 1 part per million by weight, and the metallic impurities comprise at least one metal selected from a group of metals consisting of Ti, V, Cr, Mn, Fe, Co, Ni, Cu, Zn, Zr, Mo, Pd, Ta, and W.

23. A method of growing a single-crystal of Group III-nitride (Group III-nitride crystal) in a nominal c-axis growth direction using a physical vapor transport {PVT} process in a sublimation system, wherein the Group III-nitride crystal is completely free of micropipe defects, the method comprising:
   attaching a seed material to a seed holder and forming a uniform thermal contact between the seed material and seed holder;
   placing a source material and the seed material attached to the seed holder in a reaction crucible, wherein constituent components of the sublimation system including at least the source material, the seed holder, and the reaction crucible are substantially free from unintentional impurities; and
   controlling growth temperature, growth pressure, Group III-nitride sublimation flux and composition, and a temperature gradient between the source material and the seed material or the Group III-nitride crystal growing on the seed material during the PVT process to eliminate micropipe-inducing process instabilities and grow the micropipe-free Group III-nitride crystal on the seed material, wherein the Group III-nitride sublimation flux is controlled by ramping up the growth temperature in the range of from about 0.3 to 10° C./hr.

24. A method of growing a single-crystal of semiconductor material in the nominal c-axis growth direction using a physical vapor transport (PVT) process in a sublimation system, the method comprising:
   attaching a seed material to a seed holder and forming a uniform thermal contact between the seed material and seed holder;
   placing a source material and the seed material attached to the seed holder in a reaction crucible, wherein constituent components of the sublimation system including at least the source material, the seed holder, and the reaction crucible are substantially free from unintentional impurities; and
   controlling growth temperature, growth pressure, sublimation flux and composition of the semiconductor material, and a temperature gradient between the source material and the seed material or the crystal growing on the seed material during the PVT process to eliminate micropipe-inducing process instabilities and grow the single-crystal of semiconductor material on the seed material, wherein the sublimation flux is controlled by ramping up the growth temperature in the range of from about 0.3 to 10° C./hr, wherein the single-crystal of semiconductor material is completely free of micropipe defects.

25. The method of claim 24, wherein the semiconductor material is silicon carbide.

26. The method of claim 25, further comprising controlling a growth nucleation tempera such that a modified Si/C ratio is induced during initial bulk growth.

27. The method of claim 26, wherein the growth nucleation temperature is between about 2000° C. to 2200° C.

28. The method of claim 24, wherein the semiconductor material is a Group III-nitride.

29. A method of growing a single-crystal of silicon carbide (SiC crystal) in the nominal c-axis growth direction using a physical vapor transport (PVT) process in a sublimation system, the method comprising:
   attaching a seed material to a seed holder using a controlled gap structure including thermal backside protection of the seed material;
   placing a source material and the seed material attached to the seed holder in a reaction crucible, wherein constituent components of the sublimation system including at least the source material, the seed holder, and the reaction crucible are substantially free from unintentional impurities; and
   inducing a modified Si/C ratio from the source material during initial bulk growth;
   controlling growth temperature, growth pressure, SiC sublimation flux and composition, and a temperature gradient between the source material and the seed material or the SiC crystal growing on the seed material during the PVT process to eliminate micropipe-inducing process instabilities and grow the SiC crystal on the seed material, wherein the SiC sublimation flux is controlled by ramping up the growth temperature in the range of from about 0.3 to 10° C./hr; and
   providing single crystal of silica carbide (SiC crystal) with a micropipe density of zero.

30. The method of claim 29, wherein the controlled gap structure is a physical separation maintained between the seed material and the seed holder.

31. The method of claim 29, wherein the inducing of the modified Si/C ration from the source material is provide with a growth nucleation temperature between about 2000° C. to 2200° C.

* * * * *

UNITED STATES PATENT AND TRADEMARK OFFICE
CERTIFICATE OF CORRECTION

PATENT NO. : 9,099,377 B2
APPLICATION NO. : 11/854864
DATED : August 4, 2015
INVENTOR(S) : Basceri et al.

It is certified that error appears in the above-identified patent and that said Letters Patent is hereby corrected as shown below:

IN THE CLAIMS:
Column 12, claim 5, line 26 should read:

"crystal has a polytype selected from a group of polytypes con-"

Column 12, claim 6, line 30 should read:

"than 2 $cm^{-2}$."

Column 12, claim 7, line 33 should read:

"than 1 $cm^{-2}$."

Column 12, claim 15, line 62 should read:

"controlled in a range of from about 50 to 0.1 torr."

Column 13, claim 23, line 20 should read:

"direction using a physical vapor transport (PVT) process in a"

Column 14, claim 26, line 16 should read:

"a growth nucleation temperature such that a modified Si/C ratio is"

Column 14, claim 29, line 46 should read:

"providing single crystal of silicon carbide (SiC crystal) with"

Signed and Sealed this
Twenty-second Day of December, 2015

Michelle K. Lee
*Director of the United States Patent and Trademark Office*